United States Patent
Wallner et al.

(10) Patent No.: US 8,108,643 B2
(45) Date of Patent: Jan. 31, 2012

(54) SEMICONDUCTOR MEMORY CHIP AND MEMORY SYSTEM

(75) Inventors: Paul Wallner, Prien (DE); Peter Gregorius, Munich (DE)

(73) Assignee: Qimonda AG, Munich (DE)

( * ) Notice: Subject to any disclaimer, the term of this patent is extended or adjusted under 35 U.S.C. 154(b) by 806 days.

(21) Appl. No.: 11/193,184

(22) Filed: Jul. 29, 2005

(65) Prior Publication Data

US 2007/0028028 A1 Feb. 1, 2007

(51) Int. Cl.
*G06F 12/00* (2006.01)

(52) U.S. Cl. ......... 711/167; 711/104; 711/154; 711/170

(58) Field of Classification Search .................. 711/167, 711/104, 154, 170
See application file for complete search history.

(56) References Cited

U.S. PATENT DOCUMENTS

| | | | |
|---|---|---|---|
| 6,882,082 | B2 | 4/2005 | Greeff et al. |
| 7,184,360 | B2 | 2/2007 | Gregorius et al. |
| 7,339,840 | B2 * | 3/2008 | Wallner et al. ............... 365/191 |
| 2004/0148482 | A1 * | 7/2004 | Grundy et al. ............... 711/167 |
| 2006/0285424 | A1 * | 12/2006 | Gregorius et al. ............ 365/233 |

OTHER PUBLICATIONS

Randy H Katz, Contemporary Logic Design, 1994 The Benjamin Cummings Publishing Company, Inc., pp. 359-360.*

* cited by examiner

*Primary Examiner* — Matthew Bradley
(74) *Attorney, Agent, or Firm* — Dicke, Billig & Czaja, PLLC

(57) ABSTRACT

In a semiconductor memory system having a loop forward architecture, the command, address and write data stream and the separate read data stream in form of protocol-based frames transmitted to/from memory chips in the following order: memory controller to the first memory chip, to the second memory chip, to the third memory chip and to the fourth memory chip and the read data stream is transferred from the fourth memory chip to the memory controller. With each command usually one of four memory chips is accessed for data processing, while three of four memory chips have only to fulfil a simple re-drive of CAwD stream and read data stream. By separately transferring a rank select signal not embedded in the frame from the memory controller to each memory chip a lot of more flexibility for these tasks can be achieved. Each memory chip includes a rank select switching section receiving the separately transferred rank select signal and decoding therefrom signal states which are used to select whether a CAwD signal stream is to be sent to the own memory core and processed or re-driven to the next memory chip and whether a read data stream is to be taken from its own memory core or from a read data input interface to be re-driven to the next memory chip.

12 Claims, 16 Drawing Sheets

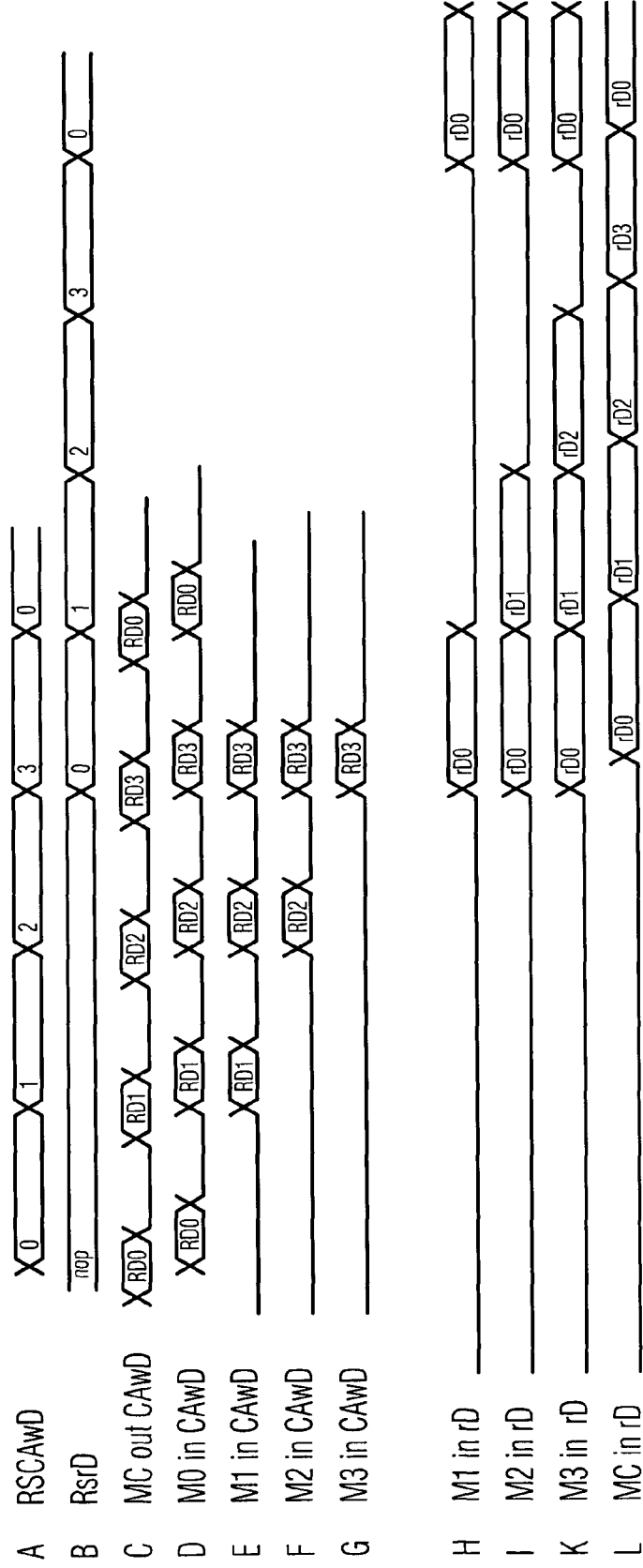

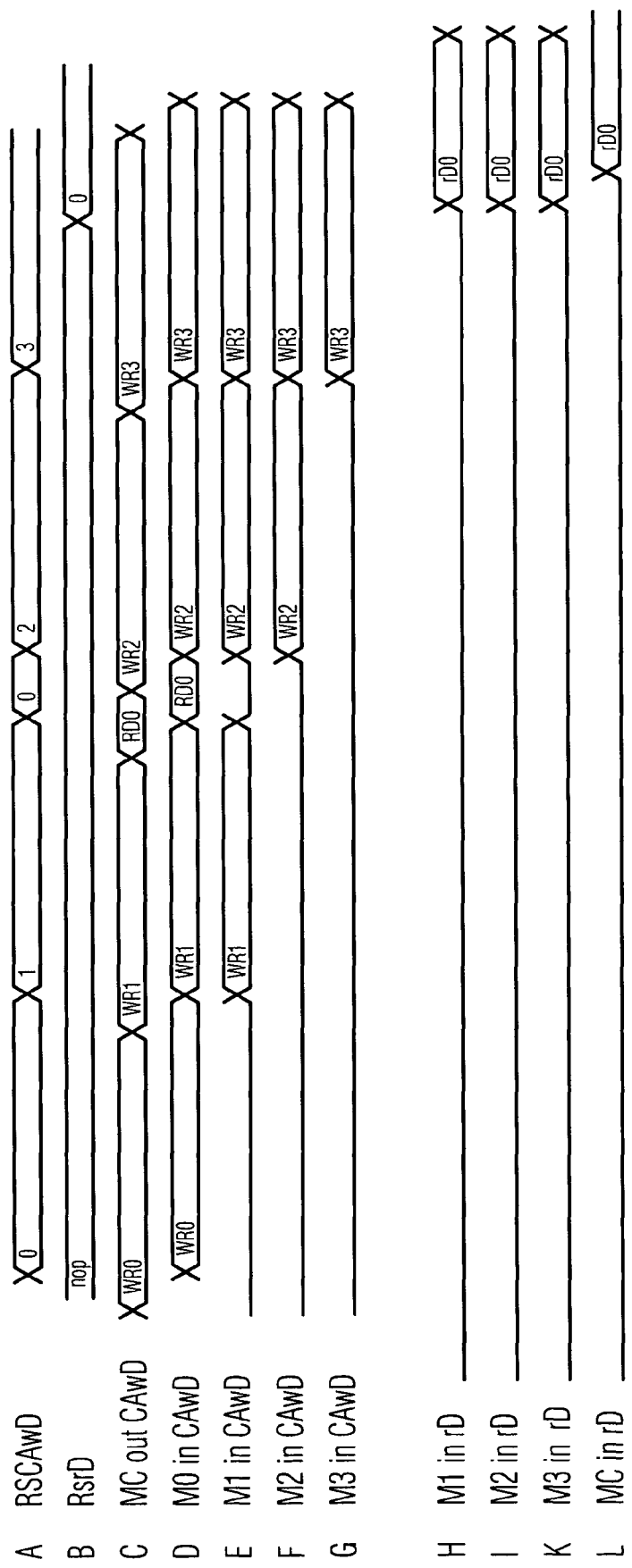

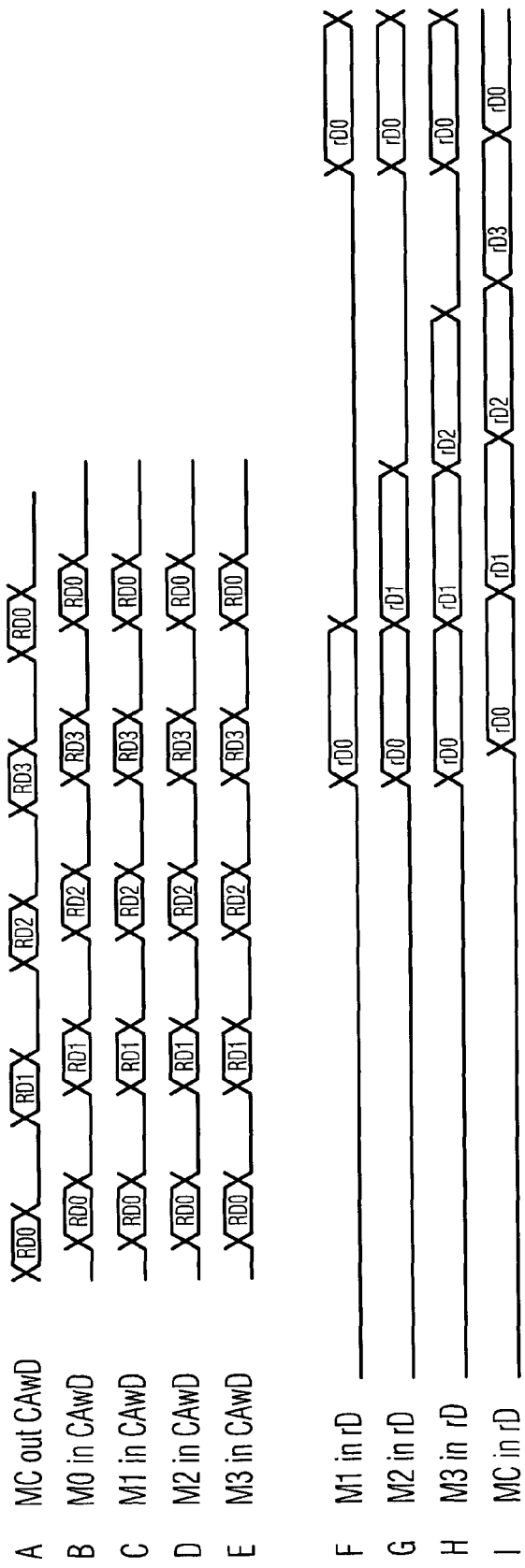

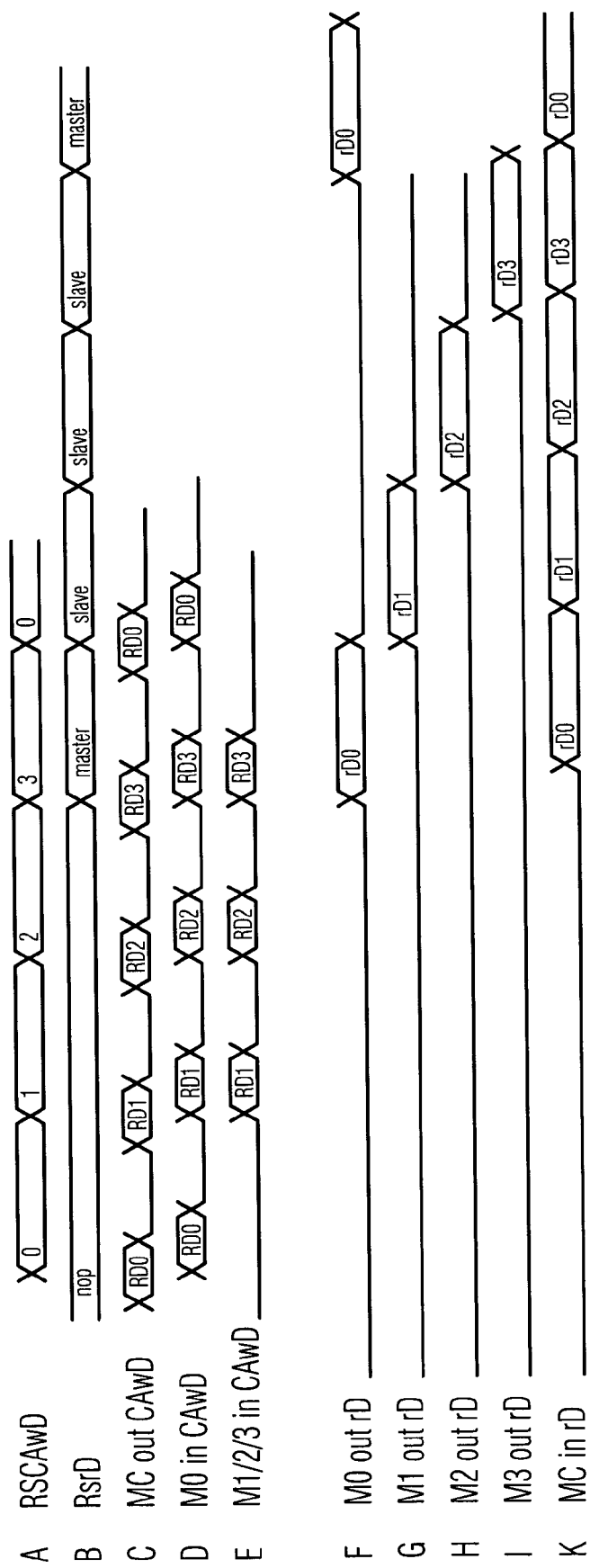

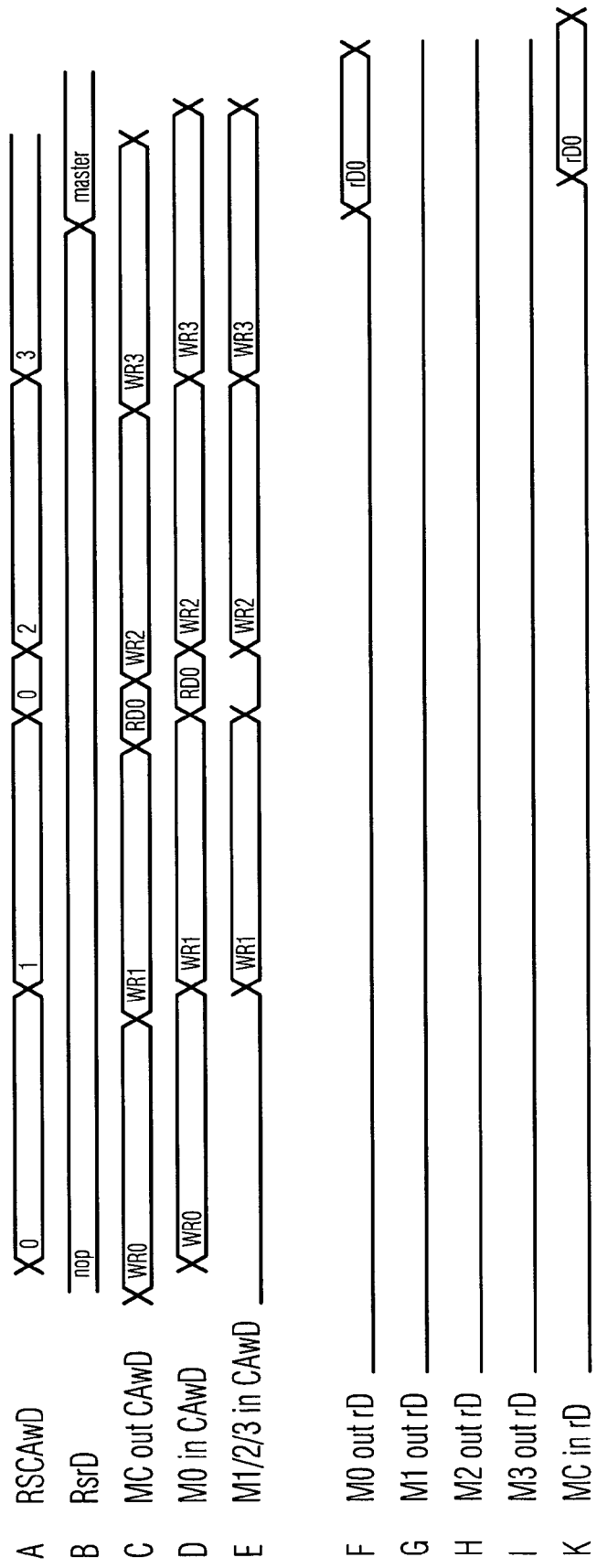

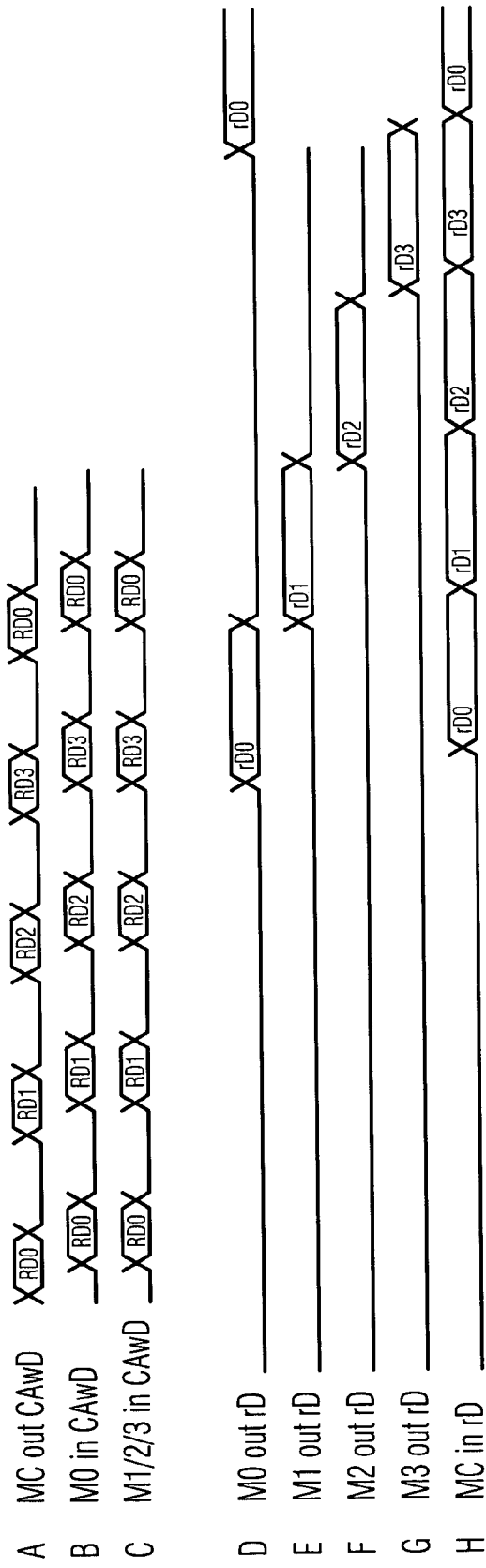

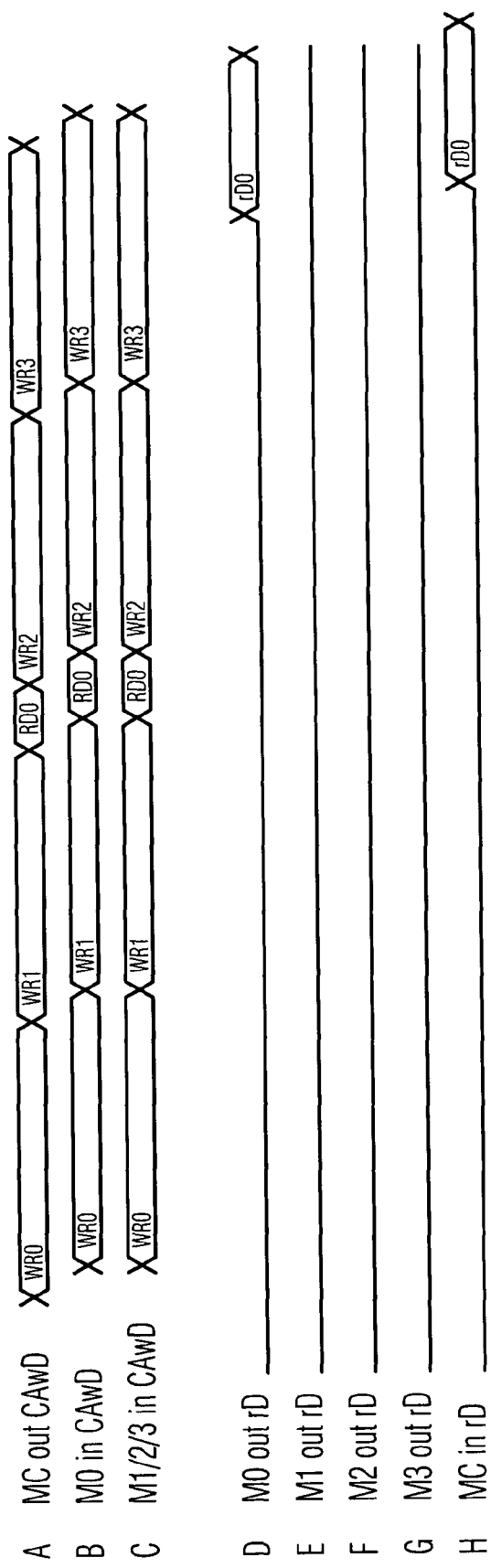

SEMICONDUCTOR MEMORY CHIP AND MEMORY SYSTEM

FIELD OF THE INVENTION

The present invention relates to a semiconductor memory chip and a semiconductor memory system in which such semiconductor memory chips are arranged on a memory module and connected to a memory controller in a predetermined topology.

BACKGROUND

Recent developments in fast semiconductor memories will lead to high speed signal transmission rates of, for example, up to 7 Gbit/s. These high signal transmission rates require careful design considerations with respect to the implementation of an appropriate topology and a suitable method of access to the memory chips on the memory module from a memory controller.

A loop forward and a star topology are possible solutions how to arrange memory chips on a memory module, such as a DIMM considering the connection to the memory controller. In the loop forward topology, the memory chips on the memory module are arranged in such a way that command/address/write data stream (CAwD) and read data stream (rD) are transferred separately. CAwD and rD streams are transmitted in form of signal frames which are based on a predefined transmission protocol. In contrast to other possible architectures, collisions between CAwD and rD are under normal circumstances not possible. With each command usually one of four memory chips is accessed for data processing, and in the loop forward architecture three of four memory chips have only to fulfil a simple re-drive of CAwD and rD, while in the star topology the re-drive function for CAwD and rD is carried out only in the master memory chip.

To separate CAwD signal and rD signal lanes, in a semiconductor memory system arranged in the loop forward topology and having, for example, four memory chips on the memory module this transfer is done in following manner: memory controller to the first memory chip, from the first memory chip to the second memory chip, from the second memory chip to the third memory chip, and from the third memory chip to the fourth memory chip and from there to the memory controller (only rD stream). In the star topology the memory chips on the memory module are arranged such that the memory controller is directly connected only to one memory chip, namely the master memory chip and this master memory chip is connected to a number of slave memory chips in a star fashion.

Up to now a proposal exists to transfer the rank select command signal within a protocol-based frame on the regular command and data stream. This is very inflexible, because
  (a) the frame must be decoded to find out what is the rank select information, i.e., which memory chip is addressed;
  (b) memory chips cannot be accessed in advance for certain set-up procedures;
  (c) memory chips cannot be accessed independently from the CAwD and rD stream;
  (d) memory chips have to separate between re-drive versus DRAM read/write procedure—with a protocol embedded, non-separated rank signal, this leads to a higher logical effort;
  (e) power consumption increases, because for decoding of rank select information main blocks in the memory chip have to be involved, even if only a re-drive has to be performed.

In consequence without a separated rank select signal a lot of decoding has to be performed, whether the currently accessed memory chip is really the one address for data processing. That is in ¾ of all cases this is needless, and thus with a separated rank select signal the information could be available for the decoding.

A lot of more flexibility could be achieved, if a rank select signal is not embedded in the protocol-based frame but instead is transmitted separately and connected directly from the memory controller to the memory module using separated pins for this rank select signal.

As a result there is a need to provide a solution how a separated rank select signal can be transferred from the memory controller to the memory chips and decoded and processed therein.

SUMMARY

In a semiconductor memory system having a loop forward architecture, the command, address and write data stream and the separate read data stream in form of protocol-based frames transmitted to/from memory chips in the following order: memory controller to the first memory chip, to the second memory chip, to the third memory chip and to the fourth memory chip and the read data stream is transferred from the fourth memory chip to the memory controller. With each command usually one of four memory chips is accessed for data processing, while three of four memory chips have only to fulfil a simple re-drive of CAwD stream and rD stream. By separately transferring a rank select signal not embedded in the frame from the memory controller to each memory chip a lot of more flexibility for these tasks can be achieved. Each memory chip includes a rank select switching section receiving the separately transferred rank select signal and decoding therefrom signal states which are used to select whether a CAwD signal stream is to be sent to the own memory core and processed or re-driven to the next memory chip and whether a read data stream is to be taken from its own memory core or from a read data input interface to be re-driven to the next memory chip.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 9A illustrates signal timing diagrams A-L of the propagation of a rank select signal, a CAwD signal and an rD signal in the present semiconductor memory system arranged in a loop forward architecture, wherein consecutive read requests RD0-1-2-3 are issued by the memory controller.

FIG. 9B depicts signal timing diagrams A-L showing the signal propagation of rank select, CAwD and rD signals upon consecutive requests WR0-1-RD0-WR2-3 in the present semiconductor memory system arranged in a loop forward architecture.

FIG. 10A depicts signal timing diagrams A-I for comparison with the signal diagrams A-L of FIG. 9A on the basis of a comparative example of a semiconductor memory system arranged in a loop forward architecture where a non-separated rank select signal is protocol embedded.

FIG. 11A depicts signal timing diagrams A-K showing the propagation of rank select, CAwD and rD signals issued from the memory controller in the present semiconductor memory system having a star topology upon consecutive read requests RD0-1-2-3 with separated rank select signal.

FIG. 11B depicts signal timing diagrams A-K showing signal propagation of rank select, CAwD and rD signals in the present semiconductor memory system having a star topology upon consecutive requests WR0-1-RD0-WR2-3 with separated rank select signal.

FIG. 12A depicts signal diagrams A-H to be compared with those of FIG. 11A on the basis of a comparative example of a semiconductor memory system having a star topology where the memory controller issues consecutive read requests RD0-1-2-3 and the system has a protocol embedded rank select signal.

FIG. 12B depicts signal diagrams A-H to be compared with those of FIG. 11B of a comparative example of a semiconductor memory system having a star topology, where the memory controller issues consecutive requests WR1-0-RD0-WR2-3- and the rank select signal is protocol embedded.

DETAILED DESCRIPTION

Figure 1:
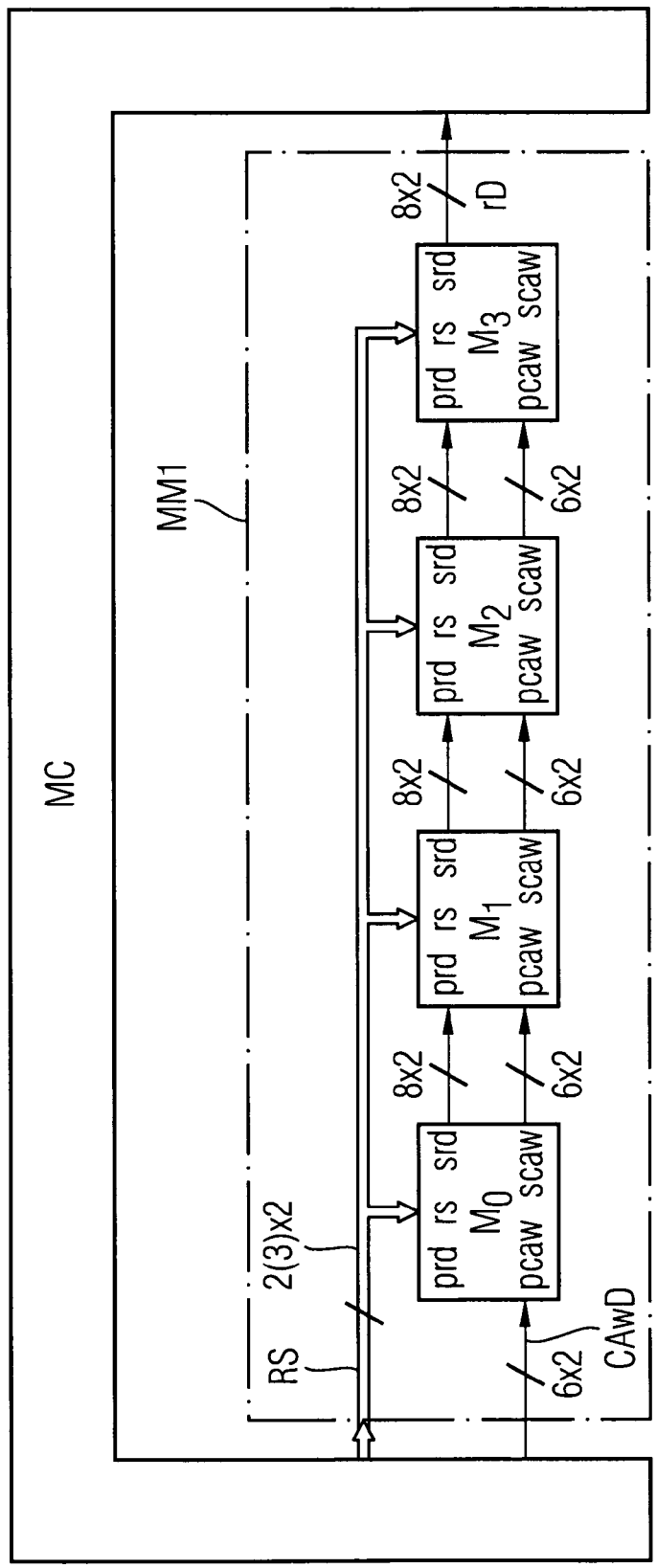
FIG. 1 is a functional block diagram of a first embodiment of a present semiconductor memory system arranged in a loop forward architecture.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a semiconductor memory chip which includes means for decoding and processing a separate rank select signal transmitted directly from a memory controller and not embedded in a protocol-based signal frame so that a very flexible and fast access to the memory chip is achieved. The performance of certain operations, for example set-up operations, power down and power on operations in advance before the actual command and data stream on the protocol basis has reached the memory chip and independent from the command and data stream will be possible. A separation between re-drive and real data processing commands in the memory chip can be efficiently performed to avoid unnecessary traffic on the lanes and that concurrent re-drive will be possible while data processing is performed in the semiconductor memory chip.

The invention also provides a semiconductor memory system which comprises a memory controller and a plurality of the proposed semiconductor memory chips arranged on a memory module and connected to the memory controller in the form of a predetermined topology.

According to a first embodiment, the present invention provides a semiconductor memory chip including a memory core and a memory interface operationally connected to the memory core, wherein the memory interface comprises:

CAwD input and output means, respectively arranged for receiving through a first CAwD signal lane a command, address and write data stream in form of signal frames according to a predefined protocol and driven from an external memory controller or re-driven from one or more preceding memory chip(s) and for transmitting through a second CAwD signal lane a command, address and write data stream to one or more memory chips succeeding in the propagation direction of the command, address and write data stream;

rD input and output means, respectively arranged for receiving through a first rD signal lane a read data signal stream in form of signal frames according to a predefined protocol and originating or re-driven from one or more preceding memory chip(s) and for transmitting through a second rD signal lane a read data signal stream originating from the own memory core and/or originating or re-driven from one or more memory chip(s) preceding in the propagation direction of the read signal stream either to the memory controller or to one or more memory chip(s) succeeding in the propagation direction of the read signal stream, and RS input means arranged for receiving through separate RS signal lane a rank select signal generated by the memory controller and not embedded in the CAwD signal frame, a rank select switching section including an RS decoder for decoding signal states of the rank select signal and a CAwD signal switching means being controlled by the decoded signal states of the rank select signal supplied from the RS decoder, so that the CAwD signal switching means direct a received command, address and write data stream either to the CAwD output means of the memory core or to the memory interface or enable a stop of processing.

In present semiconductor memory chip, the rank select switching section further includes an rD signal switching means being controlled by a decoded rank select signal state issued from the RS decoder and arranged for selecting between a read data signal stream originating from the own memory core and a read data signal stream received at the rD input means from the one or more preceding memory chips according to the decoded rank select signal state and for directing the selected read data signal stream to the rD output means to be output through the second rD signal lane to the memory controller or to the one or more succeeding memory chip(s).

In the present semiconductor memory chip as well as in the present semiconductor memory system the command, address and write data stream and the read data signal stream are serial signal streams, and the CAwD input and output means and the rD input and output means are respectively adapted for serially inputting/outputting the signal frames.

In one embodiment, in the present semiconductor memory chip the memory interface further comprises register means for registering a memory chip number sent in a set-up procedure from the memory controller through the first CAwD signal lane to the memory chip, and the RS decoder is adapted to decode the rank select signal according to the registered memory chip number.

According to a first example, the rank select signal is issued by the memory controller and input to the memory chip as a signal starting a short time before the issue of a write and a read command by the memory controller and having a duration of one write or read cycle.

According to a second alternative example, the rank select signal is issued by the memory controller and input to the memory chip as a pulsed signal starting a short time before the issue of a write and read command by the memory controller and having a pulse width essentially shorter than the duration of one write or read cycle, and the RS decoder comprises buffer means for intermediately storing and delaying the decoded pulsed rank select signal for a predetermined time period.

In a first preferred embodiment of the present semiconductor memory chip, the present rank select signal can be transmitted from the memory controller to the memory chip as a two-bit signal, and the RS decoder is arranged to decode the rank select signal to three different states:

re-drive,
processing,
no operation, and the decoded states are supplied as control signals to the rD signal switching means and the CAwD signal switching means, respectively.

According to a second essential aspect and to solve the above second object the present invention provides a semiconductor memory system comprising a memory controller and a plurality of the proposed semiconductor memory chips which are arranged together with the CAwD signal lanes and the rD signal lanes on a memory module in a predetermined topology.

According to a first embodiment of the present semiconductor memory system in accordance with the above second aspect a first CAwD signal lane is connected in a point-to-point communication between the memory controller and the first memory chip on the memory module and a second rD signal lane is connected in a point-to-point connection between the memory controller and the first memory chip, and the predetermined topology is a star topology in which the first memory chip is a dedicated master memory chip having first re-drive means arranged for redriving received command, address and write data signals designated to the further memory chip(s) on the memory module, and second re-drive means arranged for redriving received read data signals coming from one or more of the further memory chip(s) on the memory module and designated to the memory controller, the further memory chips being slave memory chips without any re-drive means, and the first and second re-drive functions of the master memory chip being controlled by the rank select switching section on the basis of the decoded rank select signal states.

According to a second embodiment of the present semiconductor memory system in accordance with the above-mentioned second aspect a first CAwD signal lane is connected in a point-to-point connection between the memory controller and the first memory chip on the memory module, and a second rD signal lane is connected in a point-to-point connection between the memory controller and the last memory chip on the memory module and wherein the predetermined topology is a loop forward topology in which all semiconductor memory chips have equal hierarchy, the first to the last but one semiconductor memory chips have first re-drive means arranged for redriving the command, address and write data signals and the second to the last semiconductor memory chips have second re-drive means arranged for redriving the read data signals, and the first and second re-drive means are controlled by the rank select switching section on the basis of the decoded rank select signal states.

The above proposed implementation of a separate rank select signal in the present semiconductor memory chip as well as in the present semiconductor memory system provides following advantageous features:

(a) flexibility to perform set-up operations in advance,
(b) flexibility to perform certain operations independently from command data stream;
(c) possibility of effective power reduction techniques due to separate information transfer;
(d) efficient separation between re-drive and real data processing commands in the memory chips thereby reduction of traffic on the lane;
(e) performance of concurrent re-drive while at the same time processing data in a certain memory chip.

The block diagram of FIG. 1 illustrates a first preferred embodiment of a present semiconductor memory system wherein a plurality of semiconductor memory chips M0-M3 are arranged on a memory module MM1 in a loop forward architecture. A first CAwD signal lane connects the first memory chip M0 on the memory module MM1 to the memory controller MC in a point-to-point fashion and a second rD signal lane connects the last memory chip M3 in a point-to-point fashion to the memory controller MC.

Further the memory chips M0-M3 on the memory module MM1 are interconnected by first and second CAwD signal lanes each for receiving a command, address and write data signal stream origination from the memory controller MC and re-driven from one or more preceding memory chip(s) and for transmitting a command, address and write data stream to one or more memory chips succeeding in propagation direction of the command, address and write data stream CAwD (from left to right) and further by first and second rD signal lanes each for receiving a read data signal stream originating or re-driven from one or more preceding memory chip(s) and for transmitting a read data signal stream originating from the own memory core and/or re-driven from one or more memory chip(s) preceding in the propagation direction of the read signal stream either to the memory controller MC or to one or more memory chip(s) succeeding in the propagation direction of the read signal stream rD (also from left to right).

Further in the present memory system depicted in FIG. 1 a separate RS signal lane is connecting the memory controller MC with the plurality of memory chips M0-M3 on the memory module MM1 for transmitting from the memory controller MC a separate rank select signal RS to a rank select switching section (not illustrated in FIG. 1) provided within each of the semiconductor memory chips M0-M3 on the memory module MM1.

In this loop forward architecture shown in FIG. 1 the command, address and write data signal streams CAwD and read data streams rD are transferred separately from MC to M0, from M0 to M1, from M1 to M2, from M2 to M3 and as concerns the read data stream rD from M3 to the memory controller MC.

Both signal streams flow in the same direction and thereby collisions between CAwD and rD are under normal circumstances not possible. The separate transmission of the rank select signal RS through the separate RS signal lane provides a high flexibility concerning the tasks of each memory chip M0-M3.

As mentioned, the CAwD signals and the rD signals are transferred as serial signals in form of signal frames on the basis of a predefined protocol. A theoretically possible solution where the rank select signal is also protocol embedded would be very inflexible and creating a lot of overhead concerning operations of the memory chips and power consumption. With a protocol-embedded rank select signal a lot of decoding has to be performed whether the currently accessed memory chip is really the one addressed for data processing, that is in case of a memory module MM1 carrying four memory chips in ¾ of all cases this is needless. With a separate rank select signal proposed by the present invention, the information is available before the decoding.

It is to be noted, that in the present semiconductor memory system depicted in FIG. 1, the CAwD signals are transmitted through the CAwD signal lanes having e.g., a 6×2 bus width, the rD signals are transmitted through the rD signal lanes having e.g., an 8×2 bus width and the rank select signal is transmitted through an RS signal lane having e.g. a 2×2 or 3×2 bus width. In this example the RS is also assumed to be differential. However it is to be understood that the bus width of these signal lanes are only examples and that for the rank select signal an arbitrary bus width is possible wherein the bus width depends on the amount of information to be transferred. However, two or three bits should be enough.

As explained before, the memory module MM1 contains a number of memory chips arranged in a consecutive manner. The number four of this embodiment is only an example. MM1 is accessed by MC with the CAwD bus providing command, addresses and write data in a protocol-based frame. Each memory chip M0-M3 has five interface sections representing the CAwD input and output means, the rD input and output means and the RS input means respectively:

prd (primary read data interface), i.e., rD input means for inputting read data, that is rD signal stream;

srd (secondary read data interface), i.e., rD output means for outputting read data, that is rD stream;

pcaw (primary command, address and write data interface), i.e., CAwD input means for inputting CAwD stream;

scaw (secondary command, address and write data interface), i.e., CAwD output means for outputting CAwD stream, and rs (rank select signal interface), that is RS input means for inputting rank select signal RS.

Figure 2:
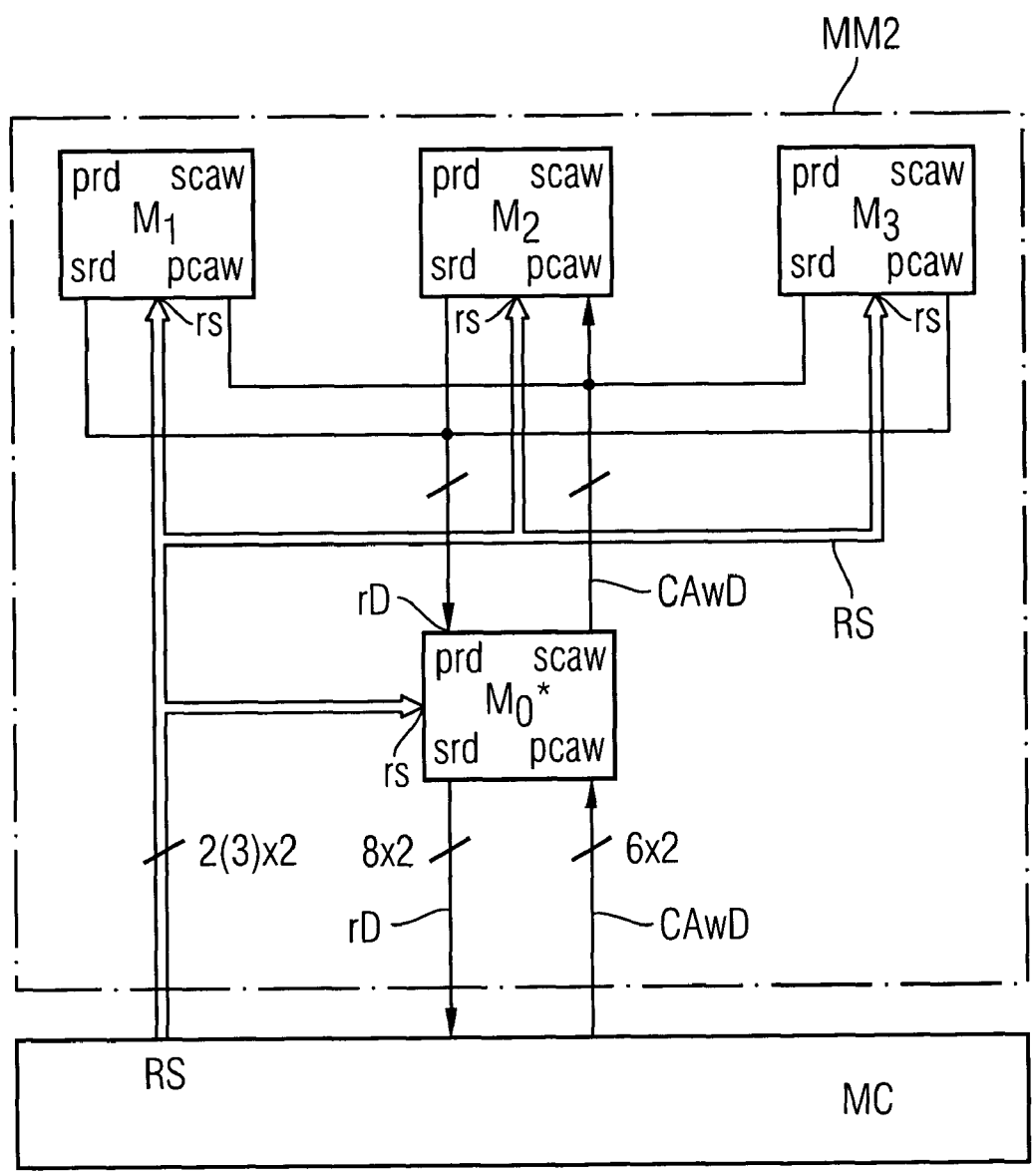
FIG. 2 is a functional block diagram of a second embodiment a the present semiconductor memory system which is arranged in a star topology.

The block diagram of FIG. 2 illustrates a second embodiment of a semiconductor memory system, wherein the memory chips M0*, M1, M2, M3 are arranged on a memory module MM2 and connected to a memory controller MC in a star topology. In this star topology the memory controller MC is connected to the first memory chip M0* in a point-to-point fashion by a first CAwD signal lane for transmitting a command, address and write data stream to the first semiconductor memory chip M0* which is a master memory chip, and this master memory chip M0* is connected by further CAwD signal lanes to a number, in this example three, slave memory chips M1, M2 and M3. Also in this embodiment, the number of four memory chips on the memory module is only one example, and the number of memory chips on the memory module MM2 may differ from four.

Like the semiconductor memory system arranged in the loop forward topology described above and depicted in FIG. 1, in the star topology according to FIG. 2 each memory chip M0*, M1-M3 has five interface sections, namely the primary read data interface section (the rD input means) prd, the secondary read data interface section (the rD output means) srd, the primary command, address and write data interface section (the CAwD input means) pcaw, the secondary command, address and write data interface section (the CAwD output means) scaw and the rank select interface section (the RS input means) rs. As mentioned before, CAwD signal streams and rD signal streams are protocol-based and the rank select signal RS is separately transmitted to all memory chips M0*, M1, M2, M3 and not embedded in the protocol-based CAwD frame. Only the master memory chip M0* utilizes all five interface sections, and the slave memory chips M1-M3 utilize only three of the interface sections, namely the secondary read data interface section srd for outputting read data, the primary command, address and write data interface section pcaw for inputting the CAwD stream and the rank select interface section rs.

The master memory chip M0* performs both, data processing and re-drive actions. However, the slave memory chips M1-M3 perform only data processing action. Re-drive mechanisms of pcaw, scaw, prd and srd interface sections work independently.

For the ease of understanding and as an example it is assumed that in the memory system of FIG. 2 the CAwD stream utilizes 6×2 differential lanes, the rD stream utilizes 8×2 differential lanes separately, the RS signal lane utilizes a 2 (3×2) differential lane.

The following discusses functional and structural features of implementation examples of the rank select signal into the semiconductor memory chips at first for the first preferred embodiment of a semiconductor memory system arranged in a loop forward architecture according to FIG. 1 and secondly for the second preferred embodiment of a semiconductor memory system arranged in a star topology according to FIG. 2.

I. Loop Forward Architecture

The rank select signal RS is decoded in the rs interface section of the memory chips to a signal called "re-drive" taking the number of the memory chips into account. Each memory chips on the memory module MM1 has its individual number. This means, that an RS decoder in the rank select interface section has to be configured during a set-up procedure according to a number of the memory chips on the memory module. For each CAwD lane a demultiplexer—controlled by the re-drive signal "re-drive" has to be established. For "re-drive"=on, the CAwD signals are transferred to the next memory chip and for "re-drive"=off, the CAwD signals are driven into the chip for decoding and performing certain commands like "read" or "write", and for "re-drive"=no operation there is no need to do anything.

In general for the rD stream, a rank select signal is not necessary, because rD streams released from different DRAMs cannot collide. Under signal integrity considerations it is however advantageous to use also the re-drive signal to multiplex between rD streams—coming from the own memory core or coming from an other memory chip and only re-driven here. Otherwise, two busses (rD from the memory core and input rD_i) would drive on the same single bus.

For read requests a different signalling is necessary, if such a multiplexer for rD streams is employed, due to the fact, that further CAwD will have been sent by the memory controller MC, rank select signal RS has to be repeated a short time before the read data are delivered by the memory core in order to set this certain memory chip in a "re-drive"=off mode back again.

The loop forward architecture in which the rank select signal RS is separately transferred from the memory controller to the memory chips on the memory module MM1 provides in combination with the last mentioned pre-requisites:

(a) flexibility for setup operation in advance;
(b) flexibility to perform certain operations independent from command data stream;
(c) makes effective power reduction techniques possible due to separate information transfer;
(d) allows to separate efficiently between re-drive and real data processing commands in the memory chips and avoids therefore traffic on lanes, and
(e) makes a concurrent re-drive possible while data processing is performed in a certain memory chip.

For the following implementation examples, it is always assumed that a (short) time before the CAwD stream arrives at the first memory chip, a rank select signal is provided to the memory chips to set up the decoders. If this assumption does not hold, for example two rank select signals sent out before one CAwD is sent out, it is necessary to store the rank select signal intermediately in a buffer as will be described below.

It is also assumed that each memory chip knows its number in the chain of memory chips on the memory module MM1. This means that a certain re-drive memory chip knows whether it is located before or after the accessed memory chip. Moreover, with this information of the memory chips number the multiplexer/demultiplexer controlled by the "re-drive" signal can be operated in three modes:
   re-drive,
   processing,
   no operation (this could mean to set the output to a high impedance-floating-state).

Regarding a single memory chip, four different cases of rank select signals in combination with a CAwD/rD stream are possible:
   1. CAwD re-drive,
   2. CAwD sent to the memory core,
   3. rD re-drive,
   4. rD sent from the memory core.

The following table 1 explains the occurrences of these possible actions considering DRAM location into account:

TABLE 1

| Case Mem. Chip location | Mem. Chip in front of | accessed Mem. Chip | Mem. Chip behind |
|---|---|---|---|
| CAwD redrive | yes | no | no |
| CAwD sent to Core | no | yes | no |
| rD redrive | no | no | yes |
| rD sent from Core | no | yes | no |

It is not defined how much information is provided with the rank select signal, that is also the bus width of the rank select signal lane is not yet fixed. The simplest case is to deliver only the number of the accessed memory chip. This represents a re-drive command to three of four memory chips and a processing command to the accessed memory chip, if four memory chips are on the memory module.

The following table 2 explains the demultiplexer/multiplexer states for the CAwD signal lanes and rD signal lanes considering the memory chips location into account:

TABLE 2

| Case Mem. Chip | Mem. Chip in front of | accessed Mem. Chip | Mem. Chip behind |
|---|---|---|---|
| CAwD bus | redrive | processing | no operation |
| rD bus | no operation | processing | redrive |

It is to be mentioned, that the present invention on the basis of the general system pre-requisites given above provides only generalized functions of the rank select decoder. The detailed circuit structure of such a decoder would depend on the width of the rank select signal lane, the kind of configuration signal and/or the kind (pulsed or continuous) of the rank select signal.

Figure 3:
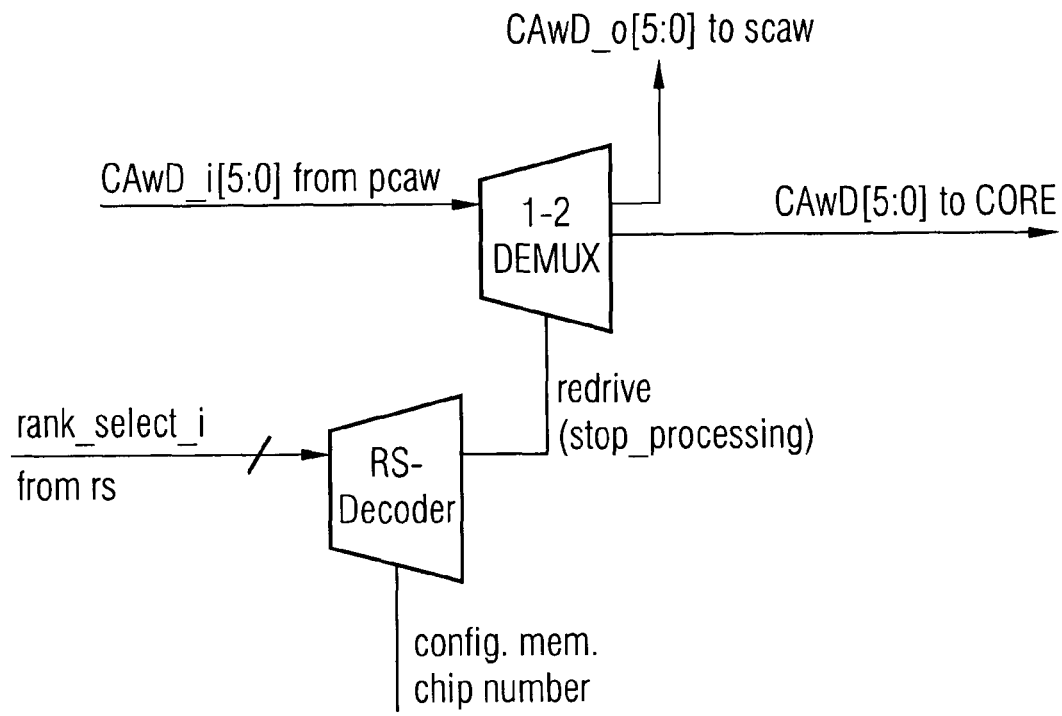
FIG. 3 schematically depicts a block diagram of a rank select switching section arranged for generating a "re-drive" signal for the CAwD stream and implemented in a present semiconductor memory chip.

The enclosed FIG. 3 illustrates an implementation of a rank select switching section for CAwD signals in the memory chip M0-M3. "Rank_select_i" from rs interface section is decoded by RS decoder to the signal "re-drive". The RS decoder further receives the configuration signal "configure mem. chip number". The "re-drive" signal representing the decoded states of "rank_select_i" controls a 1-2 demultiplexer 1-2-DEMUX which selects whether the input CAwD_i from pcaw is to be transferred to the memory core CORE or to be output as CAwD_o through the scaw interface section as a simple re-drive action or whether simply nothing is to do (holds for memory chips behind the actual data processing memory chips).

Figure 4A:
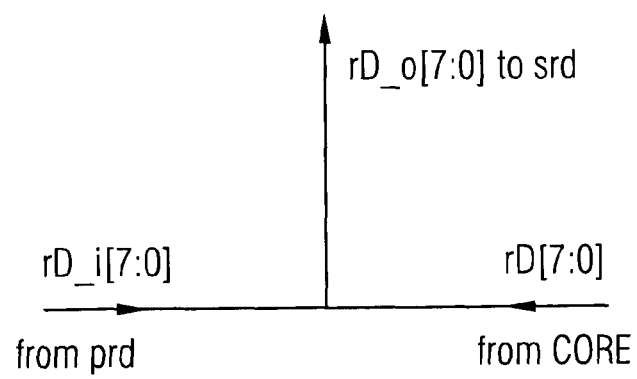
FIG. 4A schematically depicts a simplified first embodiment of rank select switching section for a rD stream without rank select decoding and switching section.

FIG. 4A illustrates a possible implementation of a rank select switching section for rD signals in the memory chip. A multiplexer is not used here because there is no collision risk.

Therefore, repeating the rank select signal when data are coming out of the memory core, is not necessary here. However, as mentioned above, a disadvantage of this approach is to create signal integrity problems connecting two busses together without switches. As a result one source bus must be always switched to the high impedance state. However, an advantage of this approach is that a repeated rank select signal (first rank select signal before CAwD is sent to the memory core and second rank select signal before rD stream is sent out from the memory core) is not necessary.

Figure 4B:
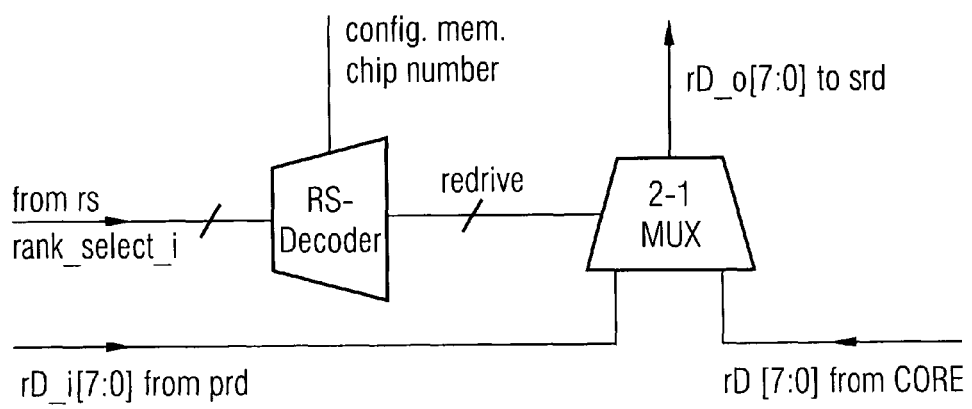
FIG. 4B schematically depicts a preferred embodiment of an enhanced rank select switching section for rD stream with multiplexer controlled by the "re-drive" signal which is decoded from the rank select signal.

FIG. 4B illustrates an implementation of the rank select switching section for rD signals of a memory chip employing a multiplexer 2-1MUX which is controlled by the "re-drive" signal decoded by the RS-decoder from the input rank select signal rank_signal_i. The multiplexer circuit 2-1MUX selects, whether an rD signal from CORE should be sent to the memory controller MC or whether an rD_i input signal from prd, which comes from a previous memory chip have to be re-driven to the memory controller MC or whether simply nothing is to do in case of a memory chip in front of the accessed one. As explained before for read requests the rank select signal has to be repeated before the rD stream is sent out of the memory core.

Figure 4C:
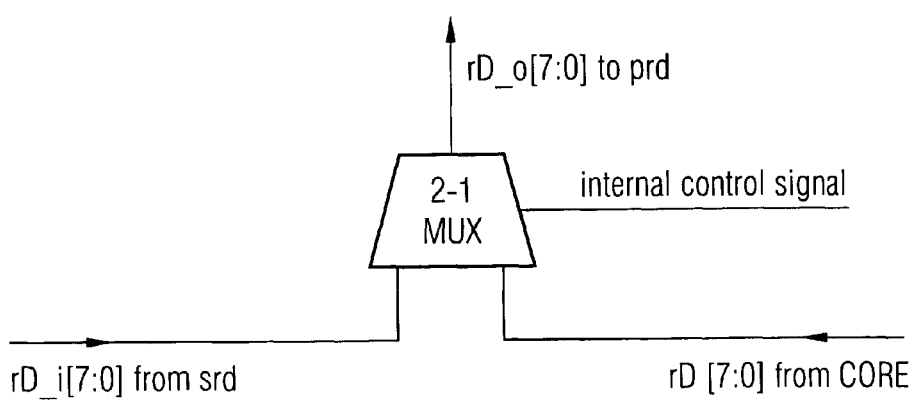
FIG. 4C schematically depicts an example of a rank select switching section for the rD stream in which a multiplexer is controlled by an internal control signal.

FIG. 4C illustrates a further example of an implementation of the rank select switching section for rD signals employing a 2-1 multiplexer 2-1MUX controlled by an internal control signal.

Figure 5:
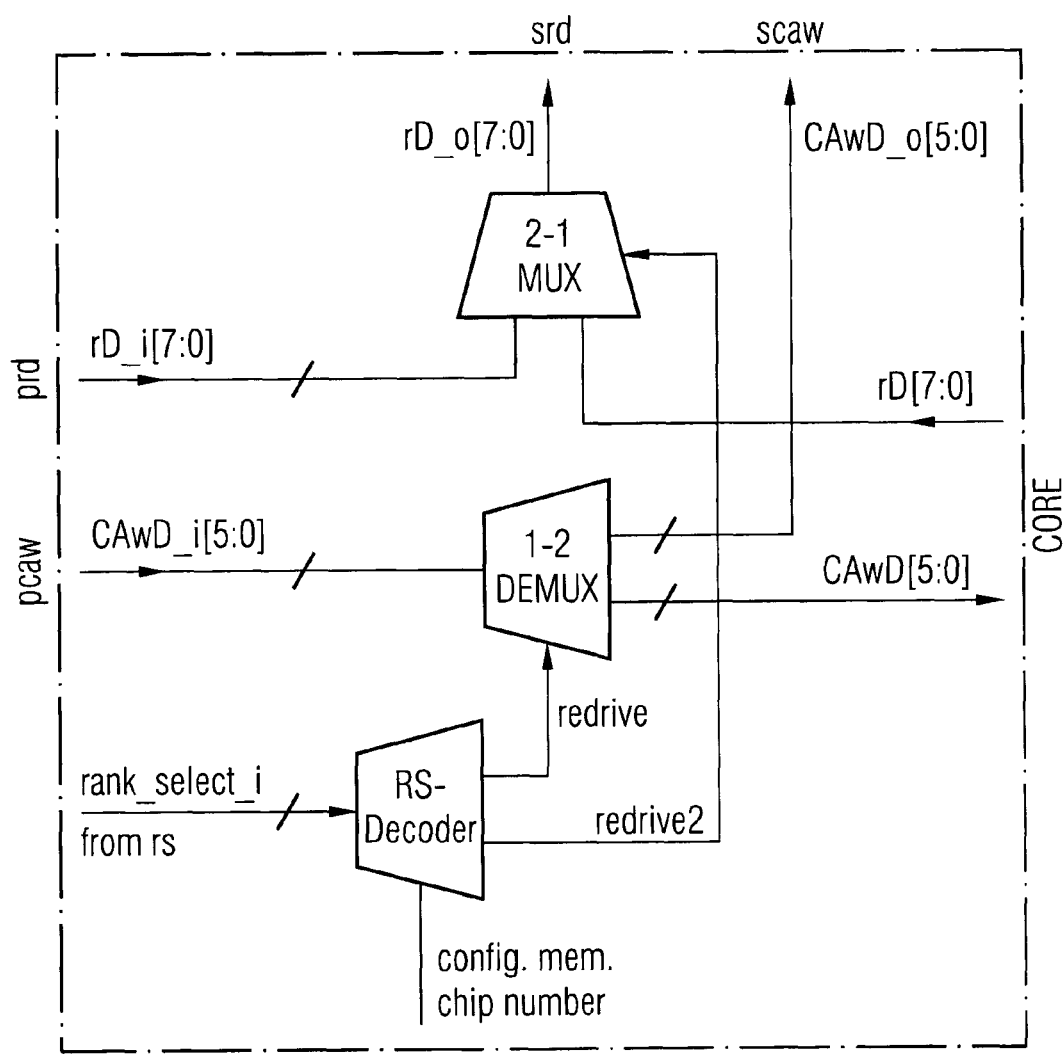
FIG. 5 schematically depicts a block diagram of a complete CAwD and rD stream I/O section which combines the rank select switching sections for the CAwD stream according to FIG. 3 and for the rD stream according to FIG. 4B.

FIG. 5 illustrates a complete CAwD and rD stream I/O section which includes a combination of the rank select switching section for the CAwD signals according to FIG. 3 and the rank select switching section for the rD signals according to FIG. 4B. For rD stream selection the 2-1MUX is employed. CAwD and rD signal streams are here selected with different re-drive signals "re-drive" and "re-drive2" based on the decoded states of "rank_select_i" as decoded by the RS decoder on the basis of a configuration signal config. mem. chip number. The CAwD and rD stream I/O section depicted in FIG. 5 represents only one implementation possibility. It will be also possible to use two different rank select signals "rank_select_i" from rs for rD and CAwD, respectively.

For certain access algorithms of the memory controller MC it should be possible that both switching sections for the rD signals and the CAwD signals share a single re-drive signal. As mentioned before, the details of the implementation of the rank select switching section depend on the number of rank select pins and memory controller behaviour.

Based on the definition of shape, duration, bus width and phase relation of the rank select signal, different structures of the rank select switching section are possible. It could be necessary to intermediately store rank select signals until the next CAwD stream arise. If a consecutive order of both, namely rank select and rD/CAwD streams holds, this can be performed by means of a buffer circuit which may be for example a FIFO unit.

Figure 6:
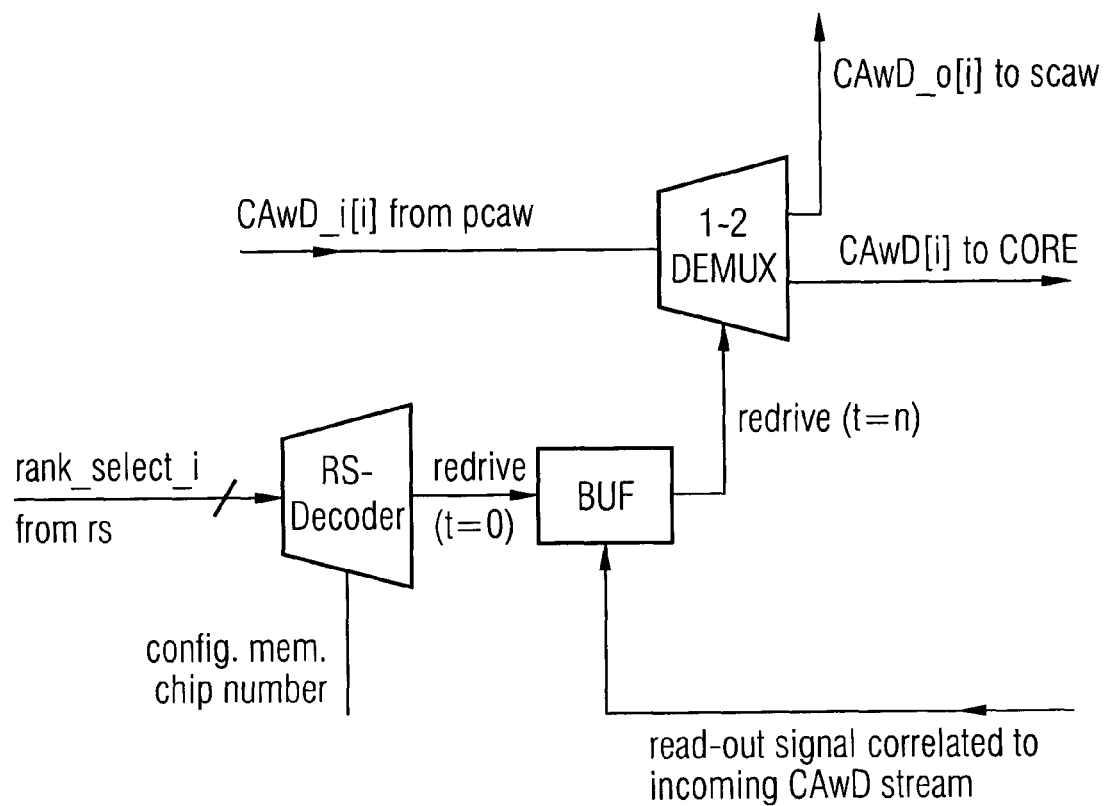
FIG. 6 schematically depicts a block diagram of an advanced rank select switching section which generates the re-drive signal for a single CAwD lane with intermediate storage (buffering) the decoded re-drive signal in a buffer for outputting the same to the demultiplexer of the rank select switching section at the required point of time.

FIG. 6 illustrates an example for a single CAwD lane. Here it is assumed that the rank select signal is pulsed leading to a re-drive signal (re-drive(t=0)) having a pulse shape. With this pulse shape, the re-drive (t=0) can be stored in a buffer circuit BUF. To readout the buffer circuit BUF another signal is necessary. This can be solved for example by using two consecutive bits of a certain CAwD lane creating a signal shape as shown before. However this has to be included in the protocol definition. Different control signal compositions seem to be possible. In general, a control signal to store the re-drive (t=0) in the buffer circuit BUF and a control signal to read out the re-drive signal from the buffer circuit BUF as a "re-drive" (t=n) signal at a later time are necessary.

Figure 7:
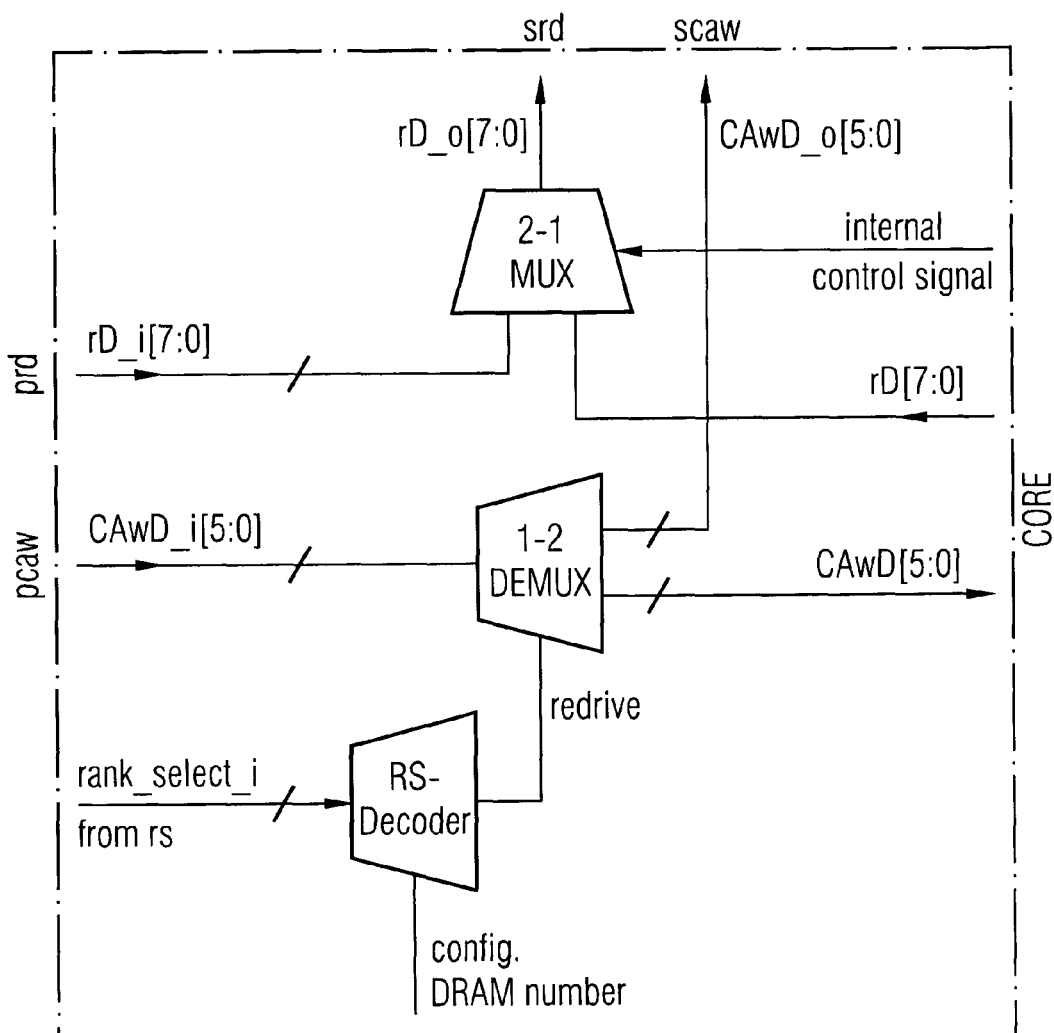
FIG. 7 schematically depicts a complete CAwD and rD stream I/O section which combines the rank select switching sections according to FIG. 3 and FIG. 4C where the rD multiplexer is controlled by the internal control signal.

FIG. 7 illustrates a further example of an implementation of the rank select switching section for both, the CAwD signal stream and the rD signal stream, where the rD multiplexer 2-1MUX is controlled by an internal control signal. Here, the rank select switching sections of FIGS. 3 and 4C are combined.

Based on a assumption that a rank select switching section of the present invention utilizes separate rank select signals for the CAwD signals and the rD signals, the signal timing diagrams A-L of FIGS. 9A and 9B explain the lane traffic on a CAwD lane and an rD lane of the first preferred embodiment of a semiconductor memory system arranged in the loop forward architecture according to FIG. 1. FIG. 9A exemplifies consecutive read requests RD0, RD1, RD2 and RD3 and FIG. 9B exemplifies consecutive requests WR0, WR1, RD0, WR2 and WR3. In FIG. 9A lines A and B respectively depict the rank select signal RSCAwD for the CAwD signal stream and a separate rank select signal RSrD for the rD signal stream which may be internally generated or provided by the memory controller; the lines C-G show the propagation of the read requests RD0-RD3 and the lines H-L show the propagation of the read data signals RD0 to RD3 and their input to the memory controller MC.

Likewise the lines A and B of FIG. 9B illustrate the issue of the rank select signals RSCAwD for the CAwD unit and RSrD for the rD unit for consecutive requests WR0, WR1, RD0, WR2 and WR3 (lines C-G of the signal diagram of FIG. 9B) and the lines H-L the propagation of the read data signal RD0 from the memory chip M0 until it arrives at the memory controller MC.

As a comparative example to be compared with FIG. 9B the lines A-I of FIG. 10A respectively show the propagation of the consecutive read request RD0, RD1, RD2, RD3 (lines A-E) and lines F-I the propagation of the read data RD0, RD1, RD2 and RD3 in a semiconductor memory system having the loop forward architecture in which a rank select signal is not separated, that is protocol embedded.

Figure 10B:
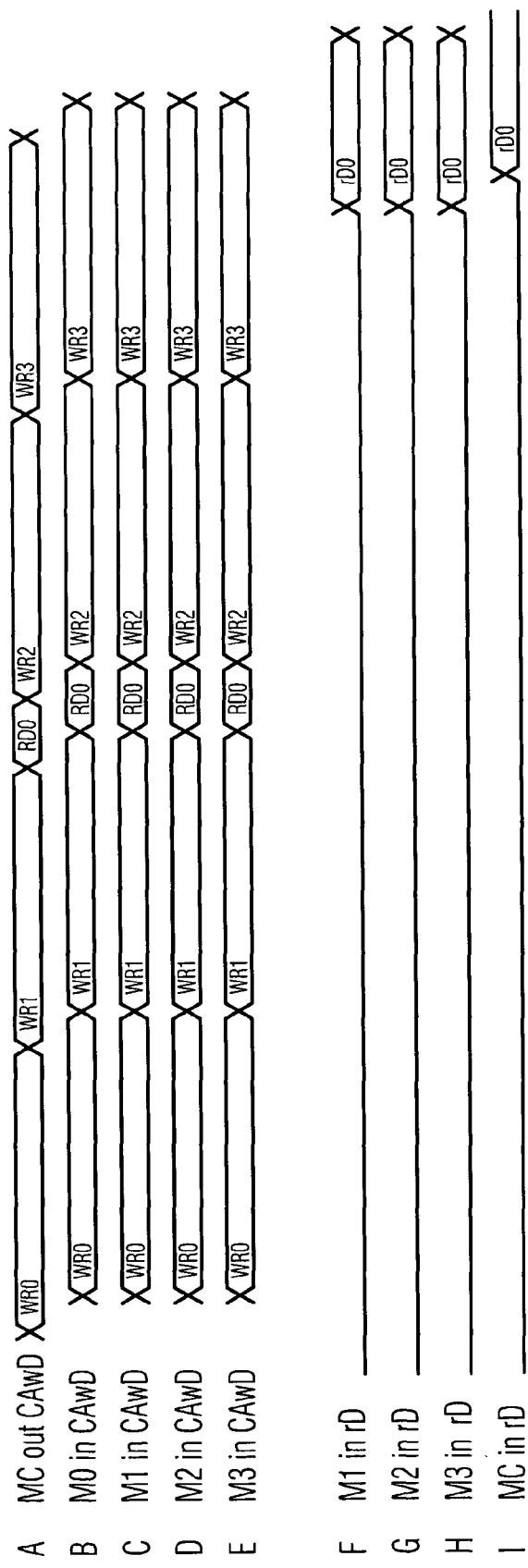
FIG. 10B depicts signal timing diagrams A-I to be compared with signal diagrams A-L in FIG. 9B on the basis of a comparative example of a semiconductor memory system having a loop forward architecture where a non-separated rank select signal is protocol embedded.

Further as a comparative example the lines A-I of FIG. 10B illustrate the propagation of consecutive requests WR0, WR1, RD0, WR2 and WR3 (lines A-E) and the lines F-I the propagation of the read data RD0 in a semiconductor memory system having a loop forward architecture when the rank select signal is not separately transmitted, that is protocol embedded. The lines A-I of FIG. 10B are to be compared with the lines C-L of FIG. 9B, respectively.

The foregoing described a preferred embodiment and variations of a memory chip implementation of a separate rank select signal, that is separated from the protocol based CAwD and rD streams in semiconductor memory chips of a first preferred embodiment of a semiconductor memory system arranged in a loop forward architecture (FIG. 1).

II. Implementation of a Separated Rank Select Signal in a Semiconductor Memory System having a Star Topology For the following implementation examples of the separate rank select signal in the memory chips of a semiconductor memory system arranged in the star topology (FIG. 2) it is always assumed that a (short) time before the CAwD stream arrives at the first (master) memory chip M0* a rank select signal RS is provided to this master memory chip M0* to set up the RS-decoder.

It is also assumed that each memory chip knows its number on the memory module MM2. This means that a certain memory chip knows whether it is the master M0* or a slave memory chip M1, M2 or M3. Moreover with this information multiplexers and demultiplexers can be operated in three modes controlled by the "re-drive" signal:
1. re-drive (master only),
2. processing (master and slave),
3. no operation (this could mean to set the outputs to a high impedance-floating-state; slave only).

So far it is not defined how much information is provided with a rank select signal, that is also the bus width of the rank select lane is not defined. The simplest case is to deliver only the number of the accessed memory chips. This represents a re-drive command to three of four memory chips and a processing command to the accessed memory chip.

The following table 3 explains the states of the multiplexer/demultiplexer for the CAwD and rD bus considering the location of the memory chip into account.

TABLE 3

| Case\| Mem. Chip location | Master Mem. Chip | Nth slave Mem. Chip | Other slave Mem. Chip |
|---|---|---|---|
| CAwD bus master access | processing | no operation | no operation |
| rD bus master access | processing | no operation | no operation |
| CAwD bus nth slave access | redrive | processing | no operation |
| rD bus nth slave access | redrive | processing | no operation |

Also in this case it is not possible to provide a detailed circuit diagram of the rank select decoder since it depends on the width of the rank select bus, the kind of the configuration signal or the kind of the rank select signal.

The rank select switching section for the CAwD unit for the master DRAM is preferably implemented in the same manner as it is explained above and depicted in FIG. 3. In this circuit implementation the rank select signal rank_select_i input from the rank select interface section rs is decoded by the RS-decoder to the signal "re-drive". The latter controls the 1-2 demultiplexer 1-2DEMUX. 1-2DEMUX selects whether the CAwD signal CAwD_o input from the interface section pcaw is to be transferred to the CORE of the memory chip or output as a simple re-drive section as CAwD_o via the scaw interface section to the next memory chip or whether simply nothing is to do (for memory chips behind the actual processing memory chip).

The rank select switching section for the CAwD unit of a slave memory chip can be based on the implementation according to FIG. 3 explained above with the only difference that the rank select switching section for the CAwD signal stream of a slave memory chip does not include the output path from 1-2DEMUX that is CAwD_o to scaw interface section, since scaw interface section of a slave memory chip is not used and therefore not necessary.

In the latter case RS-decoder decodes the input rank select signal rank_select_i to a single bit signal called "stop-processing". This "stop-processing" signal controls the 1-2DEMUX which selects, whether the CAwD signal should be transferred to the memory CORE or whether no processing is necessary. This implementation differs from that in the master memory chip, but both can be made similar by setting the configuration bits and designing the 1-2DEMUX in an adequate way considering the missing CAwD_o outputs.

An implementation example of the rank select switching section for the rD signal stream within the master memory chip M0* is identical with that shown in FIG. 4A and has the same advantages and disadvantages as explained above with reference to FIG. 4A.

An enhanced implementation of the rank select switching section for the rD signal stream of a master memory chip M0* employs a multiplexer controlled by the "re-drive" signal. That circuit part of the rank select switching section is functional and structural identical with that explained above and depicted in FIG. 4B.

An implementation of the rank select switching section for the rD signal stream of the master memory chip may have the same constructional and functional features at that shown in FIG. 4C described for the first preferred embodiment of the semiconductor memory system having the loop forward architecture.

A further possible implementation of the rank select switching section for the rD signal stream of the slave memory chips needs, in contrast to that in the master memory chip M0* no switching unit; the only task is to sent out read data.

The complete CAwD and rD stream I/O section with rank select switching for the master memory chip M0* is represented by FIG. 5 explained above for the first preferred embodiment of the semiconductor memory system having the loop forward architecture. It has also been explained above that FIG. 5 represents a combination of the rank select switching sections according to FIGS. 3 and 4B. For rD read data stream selection 2-1MUX multiplexer is employed. Also here CAwD and rD signal streams are controlled with different re-drive signals, namely "re-drive" and "re-drive2", respectively. As mentioned above, two rank select signals each for rD data stream selection and CAwD selection seem to be possible. As it is explained before implementation details depend on the number of rank select pins and memory controller behaviour.

Figure 8:
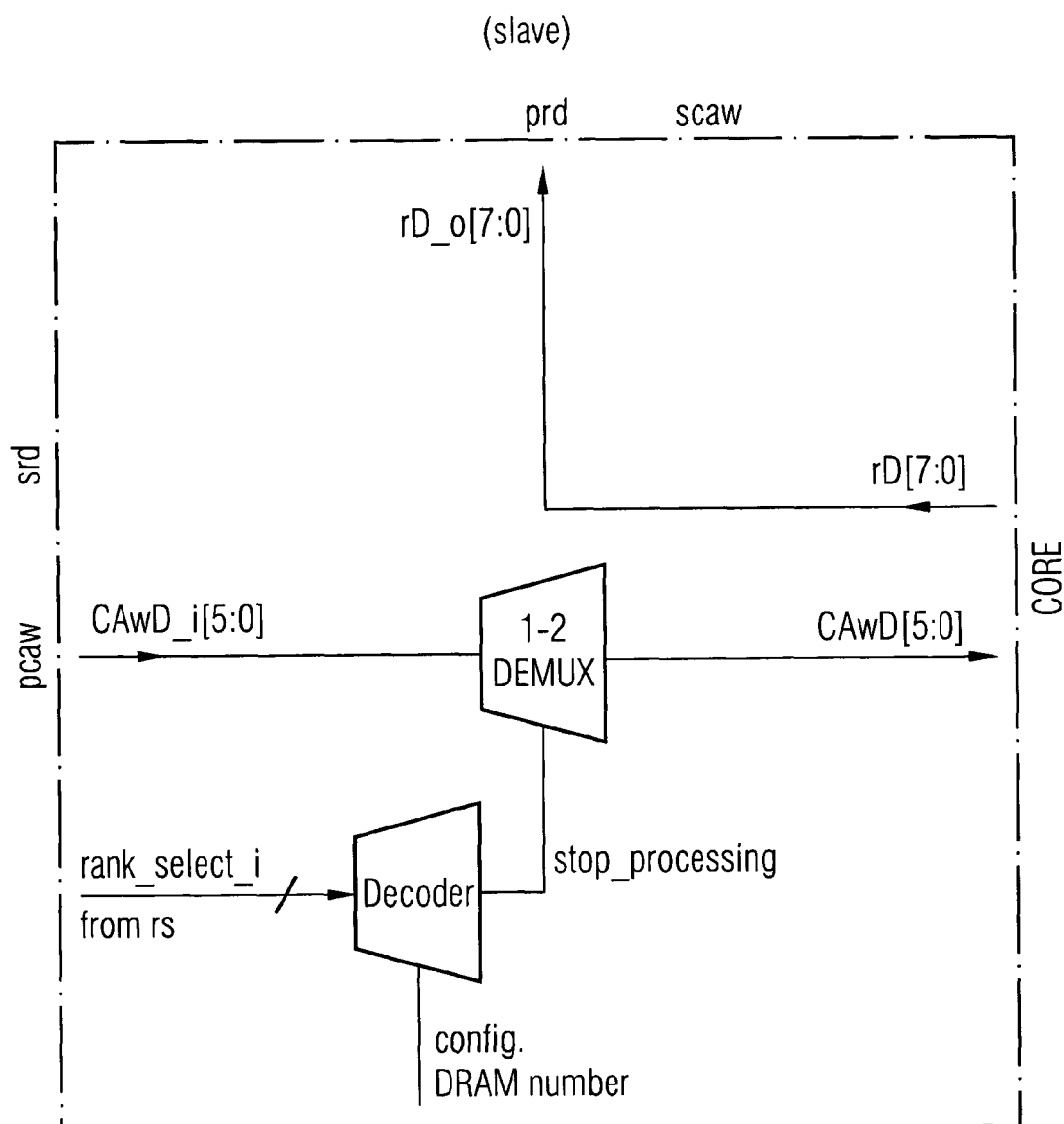
FIG. 8 schematically depicts a complete CAwD and rD stream I/O section implemented only in a slave memory chip of a memory system arranged in the star topology, where the secondary read data interface section and the secondary command, address and write data interface section are not used.

FIG. 8 represents a complete CAwD and rD stream I/O section with rank select switching in each slave memory chip M1-M3. The circuitry represents a degenerated circuitry of that in the master memory chip M0* (refer to FIG. 5).

In FIG. 8 a rank select switching is implemented only for the CAwD signal stream and not for the rD signal stream, since in the slave memory chips rD signals are always coming from the CORE and driven to the mater memory chip M0*. In general, it is preferred to have master and slave memory chips with the same circuitry production and development issues. As a result, multiplexers, demultiplexers and decoders will need some enhancement in the circuitry of the master memory chip in order to be used also in the slave memory chip (for example pins to make a preset to adjust master or slave). Nevertheless, the principle function will be unchanged.

For a better understanding of the function of the rank select switching section implemented in the master memory chip M0* and the slave memory chips M1-M3, lines A-K of FIGS. 11A and 11B respectively show the lane traffic, that is the signal propagation of the rank select signals, the CAwD signals and the read data signal RD for an example of consecutive read requests RD0, RD1, RD2 and RD3 with a separate rank select signal (FIG. 11A) and for the example of consecutive requests WR0, WR1, RD0, WR2 and WR3 with a separated rank select signal (FIG. 11B) in a semiconductor memory system having a star topology as it is shown in FIG. 2.

As comparative examples, lines A-H of FIGS. 12A and 12B respectively show the lane traffic of an example with consecutive read requests RD0, RD1, RD2 and RD3 and consecutive requests WR0, WR1, RD0, WR2 and WR3 in a comparative example of a semiconductor memory system with non-separated that is protocol embedded rank select signal, that system being arranged in a star topology. The lane traffic depicted in FIG. 12A is to be compared with that depicted in FIG. 11A and the lane traffic shown in FIG. 12B is to be compared with the shown in FIG. 11B.

The above description describes examples and embodiments of an implementation of a separated rank select signal in semiconductor memory chips of two preferred embodiments of a semiconductor memory system one being arranged in a loop forward architecture and illustrated in FIG. 1 and the other arranged in a star topology and illustrated in FIG. 2. In addition to the explained loop forward and star topologies, other topologies are possible to possess also a separated rank signal. With this separation of the rank select signal from the protocol based CAwD frame and the direct connection from the memory controller to the DIMM using separated pins for this rank select signal a lot of more flexibility can be achieved by the preferred embodiments of the present semiconductor memory system. That is, the present invention applied to the first and second preferred embodiment of a semiconductor memory system has following advantages:

(a) flexibility to perform setup operations of the memory chips by the memory controller in advance;
(b) flexibility to perform certain operations independently from command and data stream;
(c) possibility of effective power reduction techniques due to the separate information transfer;
(d) efficient differentiation between re-drive and real data processing commands in the memory chips and therefore reduction of traffic on the signal transmission lanes, and
(e) possibility of concurrent re-drive while data processing is performed in a certain memory chip.

The present invention may be applied to fast semiconductor memories of the future design, for example DRAM chips.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor memory system having a loop forward architecture, a command, address and write data stream and the separate read data stream in form of protocol-based frames transmitted to/from memory chips in the following order: memory controller to a first memory chip, to a second memory chip, to a third memory chip and to a fourth memory chip and the read data stream is transferred from the fourth memory chip to the memory controller, the semiconductor memory system comprising:
wherein each memory chip includes a rank select switching section; and
with each command one of four memory chips is accessed for data processing, while the other three of the four memory chips have only to fulfill a simple re-drive of command/address/write data stream and read data stream; and
a rank select signal not embedded in the frame from the memory controller, transferred to each memory chip at the rank select switching section receiving the separately transferred rank select signal and decoding therefrom signal states which are used to select whether a command/address/write data stream signal stream is to be sent to an own memory core and processed or re-driven to a next memory chip;
command/address/write data stream input and output means, respectively arranged for receiving through a first command/address/write data stream signal lane a command, address and write data stream in form of signal frames according to a predefined protocol and driven from an external memory controller or re-driven from one or more preceding memory chip(s) and for transmitting through a second command/address/write data stream signal lane a command, address and write data stream to one or more memory chips succeeding in the propagation direction of the command, address and write data stream;
a read data stream input and output means, respectively arranged for receiving through a first read data stream signal lane a read data signal stream in form of signal frames according to a predefined protocol and originating or re-driven from one or more preceding memory chip(s), and for transmitting through a second read data stream signal lane a read data signal stream originating from the own memory core and/or originating or re-driven from one or more memory chip(s) preceding in the propagation direction of the read signal stream either to the memory controller or to one or more memory chip(s) succeeding in the propagation direction of the read signal stream;
wherein the memory interface further comprises register means for registering a memory chip number sent in a set-up procedure from the memory controller through the first command/address/write data stream signal lane to the memory chip; and
the rank select decoder is adapted to decode the rank select signal according to the registered memory chip number.

2. A semiconductor memory system having a loop forward architecture, a command, address and write data stream and the separate read data stream in form of protocol-based frames transmitted to/from memory chips in the following order: memory controller to a first memory chip, to a second memory chip, to a third memory chip and to a fourth memory chip and the read data stream is transferred from the fourth memory chip to the memory controller, the semiconductor memory system comprising:
wherein each memory chip includes a rank select switching section; and
with each command one of four memory chips is accessed for data processing, while the other three of the four memory chips have only to fulfill a simple re-drive of command/address/write data stream and read data stream; and
a rank select signal not embedded in the frame from the memory controller, transferred to each memory chip at the rank select switching section receiving the separately transferred rank select signal and decoding therefrom signal states which are used to select whether a command/address/write data stream signal stream is to be sent to an own memory core and processed or re-driven to a next memory chip;
command/address/write data stream input and output means, respectively arranged for receiving through a first command/address/write data stream signal lane a command, address and write data stream in form of signal frames according to a predefined protocol and driven from an external memory controller or re-driven from one or more preceding memory chip(s) and for transmitting through a second command/address/write data stream signal lane a command, address and write data stream to one or more memory chips succeeding in the propagation direction of the command, address and write data stream;

a read data stream input and output means, respectively arranged for receiving through a first read data stream signal lane a read data signal stream in form of signal frames according to a predefined protocol and originating or re-driven from one or more preceding memory chip(s), and for transmitting through a second read data stream signal lane a read data signal stream originating from the own memory core and/or originating or re-driven from one or more memory chip(s) preceding in the propagation direction of the read signal stream either to the memory controller or to one or more memory chip(s) succeeding in the propagation direction of the read signal stream;

wherein the rank select signal is issued by the memory controller and input to the memory chip as a pulsed signal starting a short time before the issue of a write and read command by the memory controller and having a pulse width essentially shorter than the duration of one write or read cycle; and the rank select decoder comprises buffer means for intermediately storing and delaying the decoded pulsed rank select signal for a predetermined time period.

3. A semiconductor memory system comprising:
a memory controller; and
a plurality of semiconductor memory chips including a memory core and a memory interface operationally connected to the memory core, respectively, wherein the memory interface comprises:
  a rank select input means arranged for receiving through a separate rank select signal lane a rank select signal generated by a memory controller and not embedded in an command/address/write data stream signal frame;
  a rank select switching section including an rank select decoder for decoding signal states of the rank select signal; and
  a command/address/write data stream signal switching means being controlled by the decoded signal states of the rank select signal supplied from the rank select decoder, so that the command/address/write data stream signal switching means direct a received command, address and write data stream either to the memory core or to the command/address/write data stream output means of the memory interface or enable a stop of processing,
  wherein said plurality of semiconductor memory chips are arranged together with the command/address/write data stream signal lanes and the read data stream signal lanes on a memory module in a predetermined topology, and
wherein a first command/address/write data stream signal lane is connected in a point-to-point connection between the memory controller and the first memory chip on the memory module; and
a second read data stream signal lane is connected in a point-to-point connection between the memory controller and the first memory chip; and
the predetermined topology is a star topology in which the first memory chip is a dedicated master memory chip having:
first re-drive means arranged for redriving received command, address and write data signals designated to the further memory chip(s) on the memory module; and second re-drive means arranged for redriving received read data signals coming from one or more of the further memory chip(s) on the memory module and designated to the memory controller, the further memory chips being slave memory chips without any re-drive function, and the first and second re-drive means of the master memory chip being controlled by the rank select switching section on the basis of the decoded rank select signal states.

4. The semiconductor memory system of claim 3, wherein the command, address and write data stream is a serial signal stream, and the command/address/write data stream input and output means are adapted for serially inputting/outputting the signal frames.

5. The semiconductor memory system of claim 3, wherein the read data signal stream is a serial stream; and
  the read data stream input and output means are adapted for serially inputting/outputting the signal frames.

6. A semiconductor memory system having a loop forward architecture, a command, address and write data stream and the separate read data stream in form of protocol-based frames transmitted to/from memory chips in the following order: memory controller to a first memory chip, to a second memory chip, to a third memory chip and to a fourth memory chip and the read data stream is transferred from the fourth memory chip to the memory controller, the semiconductor memory system comprising:
  wherein each memory chip includes a rank select switching section; and
  with each command one of four memory chips is accessed for data processing, while the other three of the four memory chips have only to fulfil a simple re-drive of command/address/write data stream and read data stream; and
  a rank select signal not embedded in the frame from the memory controller, transferred to each memory chip at the rank select switching section receiving the separately transferred rank select signal and decoding therefrom signal states which are used to select whether a command/address/write data stream signal stream is to be sent to an own memory core and processed or re-driven to a next memory chip.

7. The memory system of claim 6, further comprising:
  wherein each memory is configured to determine whether a read data stream is to be taken from its memory core or from a read data input interface to be re-driven to the next memory chip.

8. The semiconductor memory chip of claim 6, further comprising:
  command/address/write data stream input and output means, respectively arranged for receiving through a first command/address/write data stream signal lane a command, address and write data stream in form of signal frames according to a predefined protocol and driven from an external memory controller or re-driven from one or more preceding memory chip(s) and for transmitting through a second command/address/write data stream signal lane a command, address and write data stream to one or more memory chips succeeding in the propagation direction of the command, address and write data stream; and
  a read data stream input and output means, respectively arranged for receiving through a first read data stream signal lane a read data signal stream in form of signal frames according to a predefined protocol and originating or re-driven from one or more preceding memory chip(s), and for transmitting through a second read data stream signal lane a read data signal stream originating from the own memory core and/or originating or re-driven from one or more memory chip(s) preceding in the propagation direction of the read signal stream either to the memory controller or to one or more memory chip(s) succeeding in the propagation direction of the read signal stream.

9. The semiconductor memory chip of claim 8, wherein the rank select switching section further includes a read data stream signal switching means being controlled by a decoded rank select signal state issued from the rank select decoder and arranged for selecting between a read data signal stream originating from the own memory core and a read data signal stream received at the read data stream input means from the one or more preceding memory chips according to the decoded rank select signal state and for directing the selected read data signal stream to the read data stream output means to be output through the second read data stream signal lane to the memory controller or to the one or more succeeding memory chip(s).

10. The semiconductor memory chip of claim 8, wherein the command, address and write data stream is a serial signal stream; and
the command/address/write data stream input and output means are respectively adapted for serially inputting/outputting the signal frames.

11. The semiconductor memory chip of claim 8, wherein the read data signal stream is a serial data stream; and
the read data stream input and output means are respectively adapted for serially inputting/outputting the signal frames.

12. A semiconductor memory chip including a memory core and a memory interface operationally connected to the memory core, wherein the memory interface comprises:
a rank select input means arranged for receiving through a separate rank select signal lane a rank select signal generated by a memory controller and not embedded in a command/address/write data stream signal frame;
a rank select switching section including a rank select decoder for decoding signal states of the rank select signal; and
a command/address/write data stream signal switching means being controlled by the decoded signal states of the rank select signal supplied from the rank select decoder, so that the command/address/write data stream signal switching means direct a received command, address and write data stream either to the memory core or to the command/address/write data stream output means of the memory interface or enable a stop of processing.

* * * * *